US011302250B2

(12) United States Patent
Wu

(10) Patent No.: US 11,302,250 B2
(45) Date of Patent: Apr. 12, 2022

(54) METHOD AND DEVICE FOR LUMINANCE ADJUSTMENT FOR DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Kerong Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 412 days.

(21) Appl. No.: 16/461,955

(22) PCT Filed: Jan. 14, 2019

(86) PCT No.: PCT/CN2019/071597
§ 371 (c)(1),
(2) Date: May 17, 2019

(87) PCT Pub. No.: WO2020/107675
PCT Pub. Date: Jun. 4, 2020

(65) Prior Publication Data
US 2021/0327346 A1 Oct. 21, 2021

(30) Foreign Application Priority Data
Nov. 27, 2018 (CN) .......................... 201811427921.0

(51) Int. Cl.
G09G 3/3233 (2016.01)
H01L 27/32 (2006.01)
(Continued)

(52) U.S. Cl.
CPC ....... *G09G 3/3233* (2013.01); *H01L 27/3262* (2013.01); *G09G 2300/0443* (2013.01);
(Continued)

(58) Field of Classification Search
CPC ... G09G 2320/0626; G09G 2320/0686; G09G 2360/16; G09G 2320/0233; G09G 3/3233;
(Continued)

(56) References Cited

U.S. PATENT DOCUMENTS

2010/0302133 A1* 12/2010 Liang ................... G09G 3/3426
345/102
2015/0287385 A1 10/2015 Wu et al.
(Continued)

FOREIGN PATENT DOCUMENTS

CN 201830496 U 5/2011
CN 102299100 A 12/2011
(Continued)

Primary Examiner — Kent W Chang
Assistant Examiner — Scott D Au
(74) Attorney, Agent, or Firm — Osha Bergman Watanabe & Burton LLP

(57) ABSTRACT

A method and a device for luminance adjustment for a display panel are provided. The method includes: dividing a display zone into a plurality of compensation zones; acquiring a difference between an initial luminance value and a pre-determined reference luminance value in each of the plurality of compensation zones; obtaining an adjusted current by adjusting a current in an organic light-emitting diode (OLED) for a sub-pixel in a compensation zone corresponding thereto according to the difference for the compensation zone; and obtaining a target luminance value by compensating the initial luminance value for the compensation zone corresponding thereto according to the adjusted current.

18 Claims, 3 Drawing Sheets

(51) Int. Cl.
*H01L 27/12* (2006.01)
*H01L 29/786* (2006.01)

(52) U.S. Cl.
CPC ............... *G09G 2320/0233* (2013.01); *G09G 2320/0686* (2013.01); *G09G 2360/16* (2013.01); *H01L 27/1222* (2013.01); *H01L 29/78696* (2013.01)

(58) Field of Classification Search
CPC ........ G09G 2300/0443; H01L 27/3262; H01L 27/1222
See application file for complete search history.

(56) References Cited

U.S. PATENT DOCUMENTS

| | | | |
|---|---|---|---|
| 2016/0196793 | A1 | 7/2016 | Xu |
| 2016/0343304 | A1 | 11/2016 | Hwang et al. |
| 2017/0193909 | A1 | 7/2017 | Song et al. |
| 2018/0374426 | A1 | 12/2018 | Chen et al. |
| 2019/0237013 | A1 | 8/2019 | Wang et al. |

FOREIGN PATENT DOCUMENTS

| | | |
|---|---|---|
| CN | 103500566 A | 1/2014 |
| CN | 104252076 A | 12/2014 |
| CN | 104465669 A | 3/2015 |
| CN | 105096834 A | 11/2015 |
| CN | 106023888 A | 10/2016 |
| CN | 107146573 A | 9/2017 |
| CN | 108281102 A | 7/2018 |
| CN | 108630148 A | 10/2018 |

\* cited by examiner

METHOD AND DEVICE FOR LUMINANCE ADJUSTMENT FOR DISPLAY PANEL

FIELD OF INVENTION

The present invention generally relates to the display technology and, more particularly, to a method and a device for luminance adjustment for a display panel.

BACKGROUND OF INVENTION

The organic light-emitting diode (OLED) display device has many advantages such as self-luminescence, low driving voltage, high luminescent efficiency, short response time, high definition and contrast, near 180° viewing angle, wide temperature range, the feasibility of flexible and large-area full-color display, and has thus become the most promising display device.

However, when a large-sized OLED panel is in operation, different IR drops occur at various positions on the panel because the cathode has a larger resistance, resulting in uneven luminance on the OLED panel. As shown in FIG. 1, the bottom of a display panel 10 is connected to a driver chip 20. The luminance of the upper half area 101 of the display panel 10 is low, while the luminance of the lower half area 102 of the display panel 10 is high.

In order to solve the above-mentioned problems, the conventional pixel driver circuit is mainly improved. For example, the 2T1C or 7T1C pixel driver circuit is used. However, since such a pixel driver circuit needs more thin-film transistors, the aperture ratio is lowered.

Therefore, there is a need to provide a method and a device for luminance adjustment for a display panel to solve the problems of the prior art.

SUMMARY OF INVENTION

It is one object of the present invention to provide a method and a device for luminance adjustment for a display panel, which is capable of increasing the aperture ratio while improving the luminance uniformity of the display panel.

To achieve the foregoing object, the present invention provides a luminance adjustment method for a display panel, including:

dividing a display zone into a plurality of compensation zones, each of the plurality of compensation zones including at least one sub-pixel, wherein the display panel includes the display zone;

acquiring a difference between an initial luminance value and a pre-determined reference luminance value in each of the plurality of compensation zones;

obtaining an adjusted current by adjusting a current in an organic light-emitting diode (OLED) for a sub-pixel in a compensation zone corresponding thereto according to the difference for the compensation zone; and obtaining a target luminance value by compensating the initial luminance value for the compensation zone corresponding thereto according to the adjusted current so that the luminance values for the compensation zones are the same;

wherein the step of adjusting the current in the organic light-emitting diode (OLED) for the sub-pixel in the compensation zone corresponding thereto according to the difference for the compensation zone includes:

adjusting the current in the organic light-emitting diode (OLED) for the sub-pixel by adjusting at least one of the width-to-length ratio of the channel and the contact resistance in a driving thin-film transistor for the sub-pixel in the compensation zone corresponding thereto according to the difference for the compensation zone, wherein the contact resistance is the load between the channel and at least one of the source and the drain of the driving thin-film transistor;

increasing the current in the organic light-emitting diode (OLED) for the sub-pixel in the compensation zone corresponding thereto when the initial luminance value is smaller than the pre-determined reference luminance value; and reducing the current in the organic light-emitting diode (OLED) for the sub-pixel in the compensation zone corresponding thereto when the initial luminance value is larger than the pre-determined reference luminance value.

The present invention further provides a luminance adjustment method for a display panel, including:

dividing a display zone into a plurality of compensation zones, each of the plurality of compensation zones including at least one sub-pixel, wherein the display panel includes the display zone;

acquiring a difference between an initial luminance value and a pre-determined reference luminance value in each of the plurality of compensation zones;

obtaining an adjusted current by adjusting a current in an organic light-emitting diode (OLED) for a sub-pixel in a compensation zone corresponding thereto according to the difference for the compensation zone; and obtaining a target luminance value by compensating the initial luminance value for the compensation zone corresponding thereto according to the adjusted current so that the luminance values for the compensation zones are the same.

The present invention further provides a luminance adjustment device for a display panel, including:

a zone dividing module configured to divide a display zone into a plurality of compensation zones, each of the plurality of compensation zones including at least one sub-pixel, wherein the display panel includes the display zone;

a difference acquisition module configured to acquire a difference between an initial luminance value and a pre-determined reference luminance value in each of the plurality of compensation zones;

an adjustment module configured to obtain an adjusted current by adjusting a current in an organic light-emitting diode (OLED) for a sub-pixel in a compensation zone corresponding thereto according to the difference for the compensation zone; and a compensation module configured to obtain a target luminance value by compensating the initial luminance value for the compensation zone corresponding thereto according to the adjusted current so that the luminance values for the compensation zones are the same.

The method and the device for luminance adjustment for a display panel according to the present invention divide a display zone into a plurality of compensation zones, acquire a difference between an initial luminance value and a pre-determined reference luminance value in each of the plurality of compensation zones, obtain an adjusted current by adjusting a current in an organic light-emitting diode (OLED) for a sub-pixel in a compensation zone corresponding thereto according to the difference for the compensation zone, and obtain a target luminance value by compensating the initial luminance value for the compensation zone corresponding thereto according to the adjusted current so that the luminance values for the compensation zones are the same. Since the luminance on every portion of the panel is adjusted to be identical by adjusting the current, the aperture ratio is increased while the luminance uniformity of the display panel is improved.

DESCRIPTION OF DRAWINGS

To better understand the features and technical aspects of the present invention, reference should be made to the accompanying drawings provided for the purposes of illustration and description only and never intended to be limit the present invention, wherein.

DETAILED DESCRIPTION OF PREFERRED EMBODIMENTS

Figure 1:
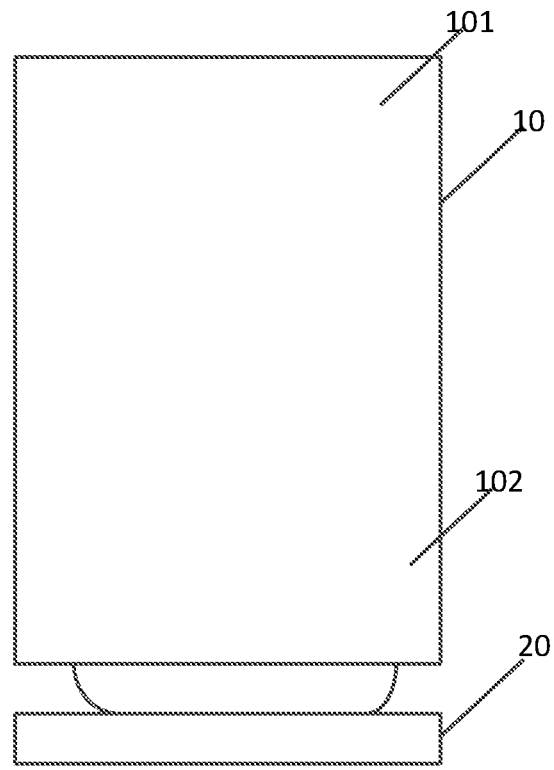
FIG. 1 is a schematic structural view of a conventional display panel.

In order to further clarify the technical means and effects of the present invention, the detailed description herein will be made in conjunction with the preferred embodiments of the present invention and the accompanying drawings.

The following descriptions of the various embodiments with reference to the accompanying drawings exemplify particular embodiments of the present invention. The directional terms mentioned in this specification, such as "upper", "lower", "front", "rear", "left", "right", "inner", "outer", "side", etc., only illustrate the directions in the accompanying drawings. Therefore, the directional terms are used for the purpose of illustration and understanding of the present invention, instead of limiting the present invention. In the drawings, like reference numerals represent the same structural elements.

The conventional AMOLED pixel driver circuit usually uses a 2T1C configuration, that is, two thin-film transistors with a capacitor structure, which converts the voltage into a current.

Figure 2:
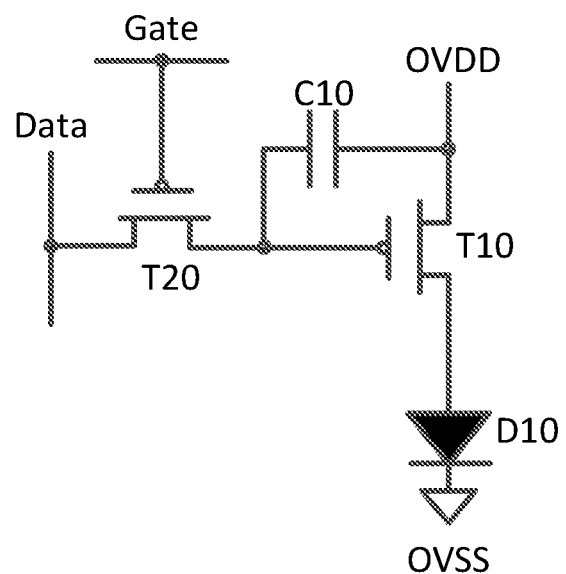
FIG. 2 is a circuit diagram of a conventional 2T1C pixel driver circuit for the AMOLED.

As shown in FIG. 2, the conventional 2T1C configuration of the AMOLED pixel driver circuit includes a first thin-film transistor T10, a second thin-film transistor T20, a capacitor C10, and an organic light-emitting diode (OLED) D10. The first thin-film transistor T10 is a driving thin-film transistor, the second thin-film transistor T20 is a switching thin-film transistor, and the capacitor C10 is a storage capacitor. More particularly, the gate of the second thin-film transistor T20 is connected to the scanning signal Gate, the source is connected to the data signal Data, and the drain is electrically connected to the gate of the first thin-film transistor T10. The source of the first thin-film transistor T10 is connected to the positive terminal of the power supply OVDD, and the drain is electrically connected to the anode of the organic light-emitting diode (OLED) D10. The cathode of the organic light-emitting diode (OLED) D10 is connected to the negative terminal of the power supply OVSS. One end of the capacitor C10 is electrically connected to the gate of the first thin-film transistor T10, and the other end is electrically connected to the source of the first thin-film transistor T10. When the 2T1C pixel driver circuit drives the AMOLED, the current flowing through the organic light-emitting diode (OLED) D10 satisfies:

$$I=k(Vgs-Vth)2;$$

where I is the current flowing through the organic light-emitting diode (OLED) D10, k is the intrinsic conductivity factor of the driving thin-film transistor, Vgs is the voltage difference between the gate and the source of the first thin-film transistor T10, and Vth is the threshold voltage of the first thin-film transistor T10. It can be seen that the current flowing through the organic light-emitting diode (OLED) D10 is related to the threshold voltage of the driving thin-film transistor.

Figure 3:
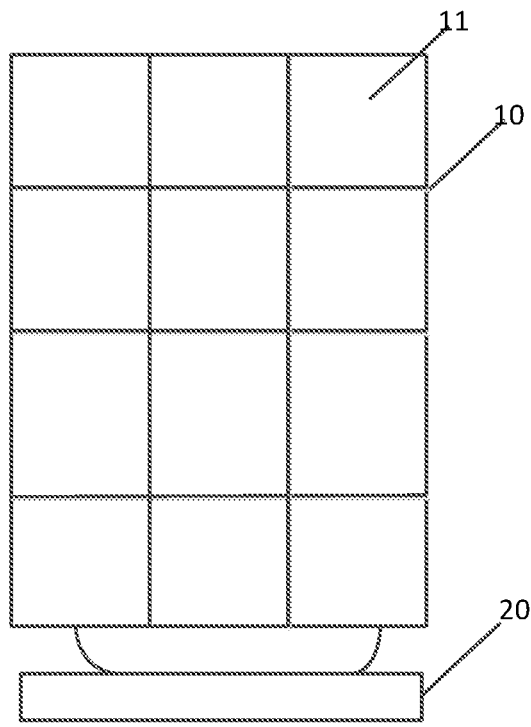
FIG. 3 is a schematic structural view of a display panel according to the present invention.

Referring to FIG. 3, the present invention provides a luminance adjustment method for a display panel, which includes the following steps:

In Step S101, the display zone is divided into a plurality of compensation zones.

More particularly, the display panel 10 includes a display zone. The display zone includes a plurality of sub-pixels. Each of the compensation zones includes at least one sub-pixel. The sub-pixels include red, green, and blue sub-pixels. The display panel is an OLED display panel.

For example, as shown in FIG. 3, the display zone is divided into a plurality of compensation zones 11. The compensation zone 11 includes one sub-pixel or at least two sub-pixels. That is, the compensation zone 11 covers at least one sub-pixel.

In Step S102, a difference between an initial luminance value and a pre-determined reference luminance value in each of the plurality of compensation zones is acquired.

For example, a difference Ld between the initial luminance value L1 of each of the compensation zones 11 and the pre-determined reference luminance value L0 is acquired. In one embodiment, the initial luminance value for each sub-pixel in the compensation zone 11 may be acquired, and then an average value of initial luminance values for each sub-pixel may be acquired as an initial luminance value in the compensation zone 11.

In Step S103, an adjusted current is obtained by adjusting a current in an organic light-emitting diode (OLED) for a sub-pixel in a compensation zone corresponding thereto according to the difference for the compensation zone.

For example, the current in the organic light-emitting diode (OLED) for the sub-pixel in the compensation zone 11 corresponding thereto is adjusted according to the Ld in the compensation zone 11. That is, the current in the organic light-emitting diode (OLED) is adjusted.

The luminance value is proportional to the current. For example, when the initial luminance value is smaller than the pre-determined reference luminance value, the current in the organic light-emitting diode (OLED) for the sub-pixel in the compensation zone 11 corresponding thereto is increased.

When the initial luminance value is larger than the pre-determined reference luminance value, the current in the organic light-emitting diode (OLED) for the sub-pixel in the compensation zone 11 corresponding thereto is reduced. It can be understood that, when the initial luminance value is equal to the pre-determined reference luminance value, the current in the organic light-emitting diode (OLED) is not adjusted.

In one embodiment, the foregoing Step S103 may include the following steps:

In Step S201, the current in the organic light-emitting diode (OLED) for the sub-pixel is adjusted by adjusting the width-to-length ratio of the channel in a driving thin-film transistor for the sub-pixel in the compensation zone corresponding thereto according to the difference for the compensation zone.

For example, the width-to-length ratio of the channel in the driving thin-film transistor for the sub-pixel in the compensation zone corresponding thereto is adjusted according to the Ld for the compensation zone 11.

The width-to-length ratio of the channel in the driving thin-film transistor is proportional to the current in the organic light-emitting diode (OLED).

In one embodiment, Step S201, in which the width-to-length ratio of the channel in the driving thin-film transistor for the sub-pixel in the compensation zone corresponding thereto is adjusted according to the difference for the compensation zone, includes the following steps:

In Step S2011, the load for the sub-pixel in the compensation zone is acquired.

For example, the load for each sub-pixel in the compensation zone 11 is acquired.

In Step S2012, the width-to-length ratio of the channel in the driving thin-film transistor for the sub-pixel in the compensation zone corresponding thereto is adjusted according to the load.

For example, the width-to-length ratio of the channel in the driving thin-film transistor for the sub-pixel in the compensation zone 11 corresponding thereto is adjusted according to the load.

In one embodiment, the width-to-length ratio of the channel in the driving thin-film transistor for the corresponding sub-pixel in the compensation zone corresponding thereto is adjusted according to the load for each sub-pixel.

In another embodiment, the width-to-length ratio of the channel in the driving thin-film transistor for each sub-pixel in the compensation zone corresponding thereto is adjusted according to the average value of the load for the sub-pixels. In other words, the width-to-length ratio of the channel in the driving thin-film transistor for each sub-pixel in each compensation zone is identical.

The foregoing Step S2012 may include the following steps:

In Step S301, a load difference between the load and a pre-determined load for a single compensation zone is acquired.

In Step S302, the width-to-length ratio of the channel in the driving thin-film transistor for the sub-pixel is adjusted according to the load difference.

For example, when the load in the compensation zone is larger than the pre-determined load, the width-to-length ratio of the channel in the driving thin-film transistor for the sub-pixel in the compensation zone is increased. When the load in the compensation zone is smaller than the pre-determined load, the width-to-length ratio of the channel in the driving thin-film transistor is reduced.

In another embodiment, the width-to-length ratio of the channel in the driving thin-film transistor is proportional to the current in the organic light-emitting diode (OLED). For example, when the initial luminance value in the compensation zone 11 is smaller than the pre-determined reference luminance value, the width-to-length ratio of the channel in the driving thin-film transistor for each sub-pixel in the compensation zone 11 corresponding thereto is increased to increase the current in the organic light-emitting diode (OLED) for the sub-pixel in the compensation zone corresponding thereto.

When the initial luminance value in the compensation zone 11 is larger than the pre-determined reference luminance value, the width-to-length ratio of the channel in the driving thin-film transistor for each sub-pixel in the compensation zone 11 corresponding thereto is reduced to reduce the current in the organic light-emitting diode (OLED) for the sub-pixel in the compensation zone corresponding thereto.

Figure 4:
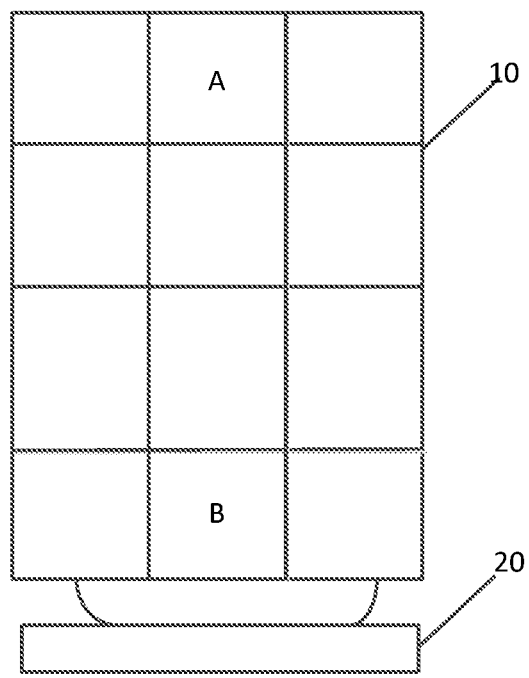
FIG. 4 is a preferred schematic structural view of a display panel according to the present invention.

As shown in FIG. 4, for example, when the initial luminance value in the compensation zone A is small, that is, the luminance is low, the width-to-length ratio of the channel in the driving thin-film transistor for each sub-pixel in the compensation zone A is increased. When the initial luminance value in the compensation zone B is large, that is, the luminance is high, the width-to-length ratio of the channel in the driving thin-film transistor for each sub-pixel in the compensation zone B is reduced so that the luminance values for the compensation zone A and the compensation zone B are the same.

In another embodiment, the foregoing step S103 may include the following steps:

In Step S202, the contact resistance in a driving thin-film transistor for the sub-pixel in the compensation zone corresponding thereto is adjusted according to the difference for the compensation zone.

The contact resistance is the load between the channel and the source and/or the drain of the driving thin-film transistor. The contact resistance is inversely proportional to the current in the organic light-emitting diode (OLED).

The foregoing Step S202, in which the contact resistance in the driving thin-film transistor for the sub-pixel in the compensation zone corresponding thereto is adjusted according to the difference for the compensation zone, includes the following steps:

In Step S401, at least one of the internal diameter and the depth of a contact hole and the electric conductivity of a filler in the contact hole in the driving thin-film transistor for the sub-pixel in the compensation zone corresponding thereto is adjusted according to the difference for the compensation zone.

The contact hole is a connecting hole between the channel and the source and/or the drain of the driving thin-film transistor. In other words, the contact hole is a connecting hole between the channel and at least one of the source and the drain. In other words, it is a source hole and/or a drain hole.

For example, the resistance of the contact resistance is related to the inner diameter (width), the depth (length), and the electrical conductivity of the contact hole. Therefore, by adjusting the above parameters, the resistance of the contact resistance can be changed, thereby adjusting the current in the organic light-emitting diode (OLED) for each sub-element to adjust the luminance in the compensation zone. For example, the electric conductivity can be changed by doping the filler material.

As shown in FIG. 4, for example, when the initial luminance value in the compensation zone A is small, that is, the luminance is low, the contact resistance of the channel in the driving thin-film transistor for each sub-pixel in the compensation zone A is reduced. When the initial luminance value in the compensation zone B is large, that is, the luminance is high, the contact resistance of the channel in the driving thin-film transistor for each sub-pixel in the compensation zone B is increased so that the luminance values for the compensation zone A and the compensation zone B are the same.

In Step S104, a target luminance value is obtained by compensating the initial luminance value for the compensation zone corresponding thereto according to the adjusted current so that the luminance values for the compensation zones are the same.

Certainly, in another embodiment, it can be understood that the width-to-length ratio and the contact resistance of the channel in the driving thin-film transistor for the sub-pixel in the compensation zone corresponding thereto can be simultaneously adjusted according to the difference for the compensation zone to adjust the current in the organic light-emitting diode (OLED) for the sub-pixel in the compensation zone.

Since the luminance value is proportional to the current, the current in the compensation zone 11 is lowered when the initial luminance value for the compensation zone is large, and the current in the compensation zone 11 is increased when the initial luminance value for the compensation zone is small. Consequently, the target luminance for each compensation zone is the same so that the luminance of the OLED panel is uniform.

Figure 5:
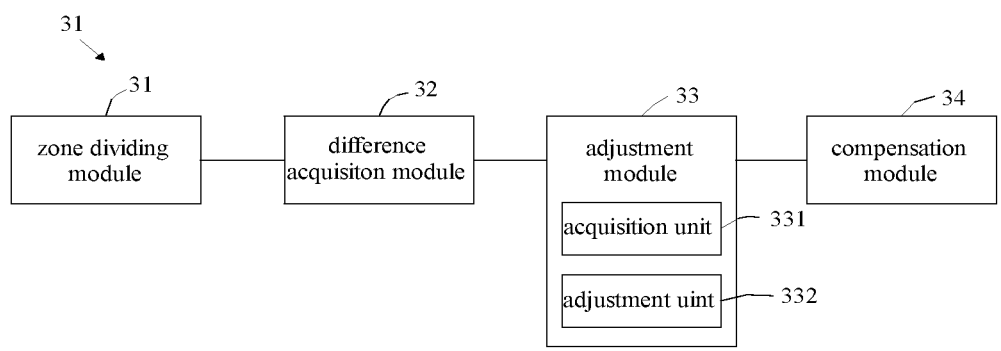
FIG. 5 is a schematic structural view of a luminance adjustment device for a display panel according to the present invention.

As shown in FIG. 5, the present invention further provides a luminance adjustment device 30 for a display panel, which includes a zone dividing module 31, a difference acquisition module 32, an adjustment module 33, and a compensation module 34.

The zone dividing module 31 is configured to divide a display zone into a plurality of compensation zones. Each of the plurality of compensation zones includes at least one sub-pixel. The display panel includes the display zone.

The difference acquisition module 32 is configured to acquire a difference between an initial luminance value and a pre-determined reference luminance value in each of the plurality of compensation zones.

The adjustment module 33 is configured to obtain an adjusted current by adjusting a current in an organic light-emitting diode (OLED) for a sub-pixel in a compensation zone corresponding thereto according to the difference for the compensation zone.

The compensation module 34 is configured to obtain a target luminance value by compensating the initial luminance value for the compensation zone corresponding thereto according to the adjusted current so that the luminance values for the compensation zones are the same.

The adjustment module 33 is specifically configured to adjust the current in the organic light-emitting diode (OLED) for the sub-pixel by adjusting the width-to-length ratio and/or the contact resistance of the channel in a driving thin-film transistor for the sub-pixel in the compensation zone corresponding thereto according to the difference for the compensation zone. The contact resistance is the load between the channel and the source and/or the drain of the driving thin-film transistor.

In one embodiment, the adjustment module 33 includes an acquisition unit 331 and an adjustment unit 332.

The acquisition unit 331 is configured to acquire the load for the sub-pixel in the compensation zone.

The adjusting unit 332 is configured to adjust the width-to-length ratio of the channel in the driving thin-film transistor for the sub-pixel in the compensation zone corresponding thereto according to the load.

The adjusting unit 332 is specifically configured to acquire a load difference between the load and a pre-determined load and adjust the width-to-length ratio of the channel in the driving thin-film transistor for the sub-pixel in the compensation zone corresponding thereto according to the load difference.

When the load in the compensation zone is larger than the pre-determined load, the adjusting unit 332 increases the width-to-length ratio of the channel in the driving thin-film transistor for the sub-pixel in the compensation zone.

When the load in the compensation zone is smaller than the pre-determined load, the adjusting unit 332 reduces the width-to-length ratio of the channel in the driving thin-film transistor for the sub-pixel in the compensation zone.

When the initial luminance value in the compensation zone is smaller than the pre-determined reference luminance value, the adjustment module 33 is configured to increase the width-to-length ratio of the channel in the driving thin-film transistor for each sub-pixel in the corresponding compensation zone to increase the current in the organic light-emitting diode (OLED) for the sub-pixel in the compensation zone corresponding thereto.

When the initial luminance value in the compensation zone is larger than the pre-determined reference luminance value, the adjustment module 33 is configured to reduce the width-to-length ratio of the channel in the driving thin-film transistor for each sub-pixel in the corresponding compensation zone to reduce the current in the organic light-emitting diode (OLED) for the sub-pixel in the compensation zone corresponding thereto.

In another embodiment, the adjustment module 33 is specifically configured to adjust at least one of the inner diameter, the depth, and the electric conductivity of a filler of the contact hole in the driving thin-film transistor corresponding to the compensation zone sub-element according to the difference for the compensation zone. The contact hole being a connection hole between the source and/or the drain and the channel.

When the initial luminance value in the compensation zone is larger than the pre-determined reference luminance value, the adjustment module 33 is configured to increase the contact resistance in the driving thin-film transistor for each sub-pixel in the corresponding compensation zone to reduce the current in the organic light-emitting diode (OLED) for the sub-pixel in the corresponding compensation zone.

When the initial luminance value in the compensation zone is smaller than the pre-determined reference luminance value, the adjustment module 33 is configured to reduce the contact resistance in the driving thin-film transistor for each sub-pixel in the corresponding compensation zone to increase the current in the organic light-emitting diode (OLED) for the sub-pixel in the corresponding compensation zone.

When the initial luminance value is smaller than the pre-determined reference luminance value, the adjustment module 33 is configured to increase the current in the organic light-emitting diode (OLED) for the sub-pixel in the corresponding compensation zone.

When the initial luminance value is larger than the pre-determined reference luminance value, the adjustment module 33 is configured to reduce the current in the organic light-emitting diode (OLED) for the sub-pixel in the corresponding compensation zone.

The method and the device for luminance adjustment for a display panel according to the present invention divide a display zone into a plurality of compensation zones, acquire a difference between an initial luminance value and a pre-determined reference luminance value in each of the plurality of compensation zones, obtain an adjusted current by adjusting a current in an organic light-emitting diode (OLED) for a sub-pixel in a compensation zone corresponding thereto according to the difference for the compensation zone, and obtain a target luminance value by compensating the initial luminance value for the compensation zone corresponding thereto according to the adjusted current so that the luminance values for the compensation zones are the same. Since the luminance on every portion of the panel is adjusted to be identical by adjusting the current, the aperture ratio is increased while the luminance uniformity of the display panel is improved.

In summary, although the present invention has been disclosed in the above preferred embodiments, the preferred embodiments are not intended to limit the invention. Various modifications may be made by those with ordinary skill in the art without departing from the spirit and scope of the invention. The scope of the present invention is defined by the claims.

What is claimed is:

1. A luminance adjustment method for a display panel, comprising:
    dividing a display zone into a plurality of compensation zones, each of the plurality of compensation zones comprising at least one sub-pixel, wherein the display panel comprises the display zone;
    acquiring a difference between an initial luminance value and a pre-determined reference luminance value in each of the plurality of compensation zones;
    obtaining an adjusted current by adjusting a current in an organic light-emitting diode (OLED) for a sub-pixel in a compensation zone corresponding thereto according to the difference for the compensation zone; and
    obtaining a target luminance value by compensating the initial luminance value for the compensation zone corresponding thereto according to the adjusted current so that the luminance values for the compensation zones are the same;
    wherein the step of adjusting the current in the organic light-emitting diode (OLED) for the sub-pixel in the compensation zone corresponding thereto according to the difference for the compensation zone comprises:
    adjusting the current in the organic light-emitting diode (OLED) for the sub-pixel by adjusting at least one of the width-to-length ratio of the channel and the contact resistance in a driving thin-film transistor for the sub-pixel in the compensation zone corresponding thereto according to the difference for the compensation zone, wherein the contact resistance is the load between the channel and at least one of the source and the drain of the driving thin-film transistor;
    increasing the current in the organic light-emitting diode (OLED) for the sub-pixel in the compensation zone corresponding thereto when the initial luminance value is smaller than the pre-determined reference luminance value; and
    reducing the current in the organic light-emitting diode (OLED) for the sub-pixel in the compensation zone corresponding thereto when the initial luminance value is larger than the pre-determined reference luminance value.

2. The luminance adjustment method for a display panel according to claim 1, wherein the step of adjusting the width-to-length ratio of the channel in the driving thin-film transistor for the sub-pixel in the compensation zone corresponding thereto according to the difference for the compensation zone comprises:
    acquiring the load for the sub-pixel in the compensation zone; and
    adjusting the width-to-length ratio of the channel in the driving thin-film transistor for the sub-pixel in the compensation zone corresponding thereto according to the load.

3. The luminance adjustment method for a display panel according to claim 2, wherein the step of adjusting the width-to-length ratio of the channel in the driving thin-film transistor for the sub-pixel in the compensation zone corresponding thereto according to the load comprises:
    acquiring a load difference between the load and a pre-determined load; and
    adjusting the width-to-length ratio of the channel in the driving thin-film transistor for the sub-pixel in the compensation zone corresponding thereto according to the load difference.

4. The luminance adjustment method for a display panel according to claim 1, comprising:
    increasing the width-to-length ratio of the channel in the driving thin-film transistor for the sub-pixel in the compensation zone when the load in the compensation zone is larger than the pre-determined load; and
    reducing the width-to-length ratio of the channel in the driving thin-film transistor for the sub-pixel in the compensation zone when the load in the compensation zone is smaller than the pre-determined load.

5. The luminance adjustment method for a display panel according to claim 1, wherein the step of adjusting the contact resistance in the driving thin-film transistor for the sub-pixel in the compensation zone corresponding thereto according to the difference for the compensation zone comprises:
    adjusting at least one of the internal diameter and the depth of a contact hole and the electric conductivity of a filler in the contact hole in the driving thin-film transistor for the sub-pixel in the compensation zone corresponding thereto according to the difference for the compensation zone, the contact hole being a connecting hole between the channel and at least one of the source and the drain of the driving thin-film transistor.

6. The luminance adjustment method for a display panel according to claim 1, comprising:
    increasing the contact resistance in the driving thin-film transistor for the sub-pixel in the compensation zone corresponding thereto when the initial luminance value in the compensation zone is larger than the pre-determined reference luminance value; and
    reducing the contact resistance in the driving thin-film transistor for the sub-pixel in the compensation zone corresponding thereto when the initial luminance value in the compensation zone is smaller than the pre-determined reference luminance value.

7. The luminance adjustment method for a display panel according to claim 1, wherein the width-to-length ratio of the channel in the driving thin-film transistor for the sub-pixel is proportional to the current in the organic light-emitting diode (OLED) for the sub-pixel.

8. A luminance adjustment method for a display panel, comprising:
    dividing a display zone into a plurality of compensation zones, each of the plurality of compensation zones comprising at least one sub-pixel, wherein the display panel comprises the display zone;
    acquiring a difference between an initial luminance value and a pre-determined reference luminance value in each of the plurality of compensation zones;
    obtaining an adjusted current by adjusting a current in an organic light-emitting diode (OLED) for a sub-pixel in a compensation zone corresponding thereto according to the difference for the compensation zone; and
    obtaining a target luminance value by compensating the initial luminance value for the compensation zone corresponding thereto according to the adjusted current so that the luminance values for the compensation zones are the same;
wherein the step of adjusting the current in the organic light-emitting diode (OLED) for the sub-pixel in the compensation zone corresponding thereto according to the difference for the compensation zone comprises:
adjusting the current in the organic light-emitting diode (OLED) for the sub-pixel by adjusting at least one of the width-to-length ratio of the channel and the contact resistance in a driving thin-film transistor for the sub-pixel in the compensation zone corresponding thereto according to the difference for the compensation zone, wherein the contact resistance is the load between the channel and at least one of the source and the drain of the driving thin-film transistor.

9. The luminance adjustment method for a display panel according to claim 8, wherein the step of adjusting the width-to-length ratio of the channel in the driving thin-film transistor for the sub-pixel in the compensation zone corresponding thereto according to the difference for the compensation zone comprises:
acquiring the load for the sub-pixel in the compensation zone; and
adjusting the width-to-length ratio of the channel in the driving thin-film transistor for the sub-pixel in the compensation zone corresponding thereto according to the load.

10. The luminance adjustment method for a display panel according to claim 9, wherein the step of adjusting the width-to-length ratio of the channel in the driving thin-film transistor for the sub-pixel in the compensation zone corresponding thereto according to the load comprises:
acquiring a load difference between the load and a pre-determined load; and
adjusting the width-to-length ratio of the channel in the driving thin-film transistor for the sub-pixel in the compensation zone corresponding thereto according to the load difference.

11. The luminance adjustment method for a display panel according to claim 9, comprising:
increasing the width-to-length ratio of the channel in the driving thin-film transistor for the sub-pixel in the compensation zone when the load in the compensation zone is larger than the pre-determined load; and
reducing the width-to-length ratio of the channel in the driving thin-film transistor for the sub-pixel in the compensation zone when the load in the compensation zone is smaller than the pre-determined load.

12. The luminance adjustment method for a display panel according to claim 8, wherein the step of adjusting the contact resistance in the driving thin-film transistor for the sub-pixel in the compensation zone corresponding thereto according to the difference for the compensation zone comprises:
adjusting at least one of the internal diameter and the depth of a contact hole and the electric conductivity of a filler in the contact hole in the driving thin-film transistor for the sub-pixel in the compensation zone corresponding thereto according to the difference for the compensation zone, the contact hole being a connecting hole between the channel and at least one of the source and the drain of the driving thin-film transistor.

13. The luminance adjustment method for a display panel according to claim 8, comprising:
increasing the contact resistance in the driving thin-film transistor for the sub-pixel in the compensation zone corresponding thereto when the initial luminance value in the compensation zone is larger than the pre-determined reference luminance value; and
reducing the contact resistance in the driving thin-film transistor for the sub-pixel in the compensation zone corresponding thereto when the initial luminance value in the compensation zone is smaller than the pre-determined reference luminance value.

14. The luminance adjustment method for a display panel according to claim 8, comprising:
increasing the current in the organic light-emitting diode (OLED) for the sub-pixel in the compensation zone corresponding thereto when the initial luminance value is smaller than the pre-determined reference luminance value; and
reducing the current in the organic light-emitting diode (OLED) for the sub-pixel in the compensation zone corresponding thereto when the initial luminance value is larger than the pre-determined reference luminance value.

15. A luminance adjustment device for a display panel, comprising:
a zone dividing module configured to divide a display zone into a plurality of compensation zones, each of the plurality of compensation zones comprising at least one sub-pixel, wherein the display panel comprises the display zone;
a difference acquisition module configured to acquire a difference between an initial luminance value and a pre-determined reference luminance value in each of the plurality of compensation zones;
an adjustment module configured to obtain an adjusted current by adjusting a current in an organic light-emitting diode (OLED) for a sub-pixel in a compensation zone corresponding thereto according to the difference for the compensation zone, wherein the adjustment module is configured to adjust the current in the organic light-emitting diode (OLED) for the sub-pixel by adjusting at least one of the width-to-length ratio of the channel and the contact resistance in a driving thin-film transistor for the sub-pixel in the compensation zone corresponding thereto according to the difference for the compensation zone, wherein the contact resistance is the load between the channel and at least one of the source and the drain of the driving thin-film transistor; and
a compensation module configured to obtain a target luminance value by compensating the initial luminance value for the compensation zone corresponding thereto according to the adjusted current so that the luminance values for the compensation zones are the same.

16. The luminance adjustment device according to claim 15, wherein the adjustment module comprises:
an acquisition unit configured to acquire the load for the sub-pixel in the compensation zone; and
an adjustment unit configured to adjust the width-to-length ratio of the channel in the driving thin-film transistor for the sub-pixel in the compensation zone corresponding thereto according to the load.

17. The luminance adjustment device according to claim 16, wherein the adjustment unit is configured to acquire a load difference between the load and a pre-determined load and adjust the width-to-length ratio of the channel in the driving thin-film transistor for the sub-pixel in the compensation zone corresponding thereto according to the load difference.

18. The luminance adjustment device according to claim 16, wherein:
  the adjustment unit increases the width-to-length ratio of the channel in the driving thin-film transistor for the sub-pixel in the compensation zone when the load in the compensation zone is larger than the pre-determined load; and
  the adjustment unit reduces the width-to-length ratio of the channel in the driving thin-film transistor for the sub-pixel in the compensation zone when the load in the compensation zone is smaller than the pre-determined load.

* * * * *